United States Patent [19]

Muto

[11] Patent Number: 4,714,844

[45] Date of Patent: Dec. 22, 1987

[54] LOGARITHMIC COMPRESSION CIRCUIT

[75] Inventor: Kazuhiko Muto, Kawasaki, Japan

[73] Assignee: Canon Kabushiki Kaisha, Tokyo, Japan

[21] Appl. No.: 848,292

[22] Filed: Apr. 4, 1986

[30] Foreign Application Priority Data

Apr. 11, 1985 [JP] Japan ........................ 60-75273

[51] Int. Cl.⁴ .................. G06G 7/24; H03K 5/22; H03K 17/687

[52] U.S. Cl. .................. 307/494; 328/145; 333/14; 307/571

[58] Field of Search .................. 307/494, 490, 571; 328/142-145; 333/14

[56] References Cited

U.S. PATENT DOCUMENTS

| | | | |
|---|---|---|---|
| 3,735,149 | 5/1973 | Tuchiya | 307/492 |
| 4,506,174 | 3/1985 | Hitt | 328/144 |

FOREIGN PATENT DOCUMENTS

| | | | |
|---|---|---|---|
| 1595895 | 8/1981 | United Kingdom | 307/492 |
| 1117660 | 10/1984 | U.S.S.R. | 307/492 |

*Primary Examiner*—Stanley D. Miller
*Assistant Examiner*—B. P. Davis
*Attorney, Agent, or Firm*—Fitzpatrick, Cella, Harper & Scinto

[57] ABSTRACT

A logarithmic compression circuit comprising an operational amplifier and a transistor for logarithmic compression. One of the emitter and collector of the transistor is connected to the inverting input of the amplifier and the other of the emitter and collector of the transistor is connected to the output of the amplifier. A switching device is selectively connected between the base of the transistor and the non-inverting input of the amplifier and between the base and the said one of the emitter and collector of the transistor in accordance with the magnitude of a signal current input.

7 Claims, 5 Drawing Figures

LOGARITHMIC COMPRESSION CIRCUIT

BACKGROUND OF THE INVENTION

1. Field of the Invention

The present invention relates to a logarithmic compression circuit and particularly to a logarithmic compression circuit which performs logarithmic compression using a transistor.

2. Related Background Art

Prior art logarithmic compression circuits will be described with respect to the drawings.

FIGS. 1A and 1B are schematics of prior art logarithmic compression circuits. Reference numeral 1 denotes an operational amplifier; reference numeral 2 a logarithmic compression transistor; reference numeral 3 an inverting input terminal of the amplifier; and reference numeral 4 a non-inverting input terminal of the amplifier. The signal current flowing into input terminal 3 is converted by transistor 2 into a logarithmically compressed voltage. In the circuit of FIG. 1A, the base terminal of transistor 2 is connected with the collector terminal of same. In the circuit of FIG. 1B, the base terminal of transistor 2 is connected with non-inverting input terminal 4 of the amplifier. According to the circuit construction of FIG. 1A, the occurrence of oscillations is difficult, but the logarithmic compression characteristic is deteriorated when a low signal current is input. According to the circuit construction of FIG. 1B, the logarithmic compression characteristic is good, but, disadvantageously, the circuit is likely to oscillate when a high signal current is input.

SUMMARY OF THE INVENTION

In view of the above prior art problems, an object of the present invention is to prevent deterioration of the logarithmic compression characteristic of a logarithmic compression circuit when a low signal current is input thereto and to prevent oscillation of the circuit when a high signal current is input thereto.

Another object of the present invention is to provided a logarithmic compression circuit which includes switching means provided at the base terminal of a logarithmic compression transistor.

BRIEF DESCRIPTION OF THE DRAWINGS

FIG. 1A being a diagram of a compression circuit suitable for a high signal current input; and FIG. 1B being a diagram of a compression circuit suitable for a lower signal current input.

FIG. 2A being a diagram of a circuit in which an NPN transistor is used for logarithmic compression; and FIG. 2B being a diagram of a circuit in which a PNP transistor is used for logarithmic compression.

DETAILED DESCRIPTION OF THE PREFERRED EMBODIMENTS

The embodiments of the present invention will now be described in more detail with respect to the drawings.

Figure 2A:
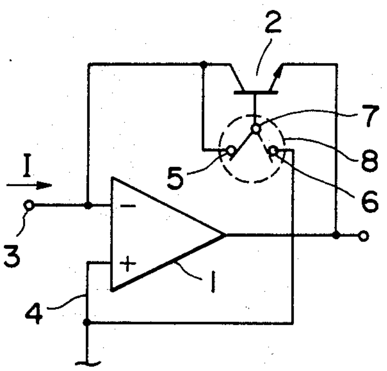
FIGS. 2A and 2B are first and second embodiments of a logarithmic compression circuit according to the present invention.
Figure 2B:
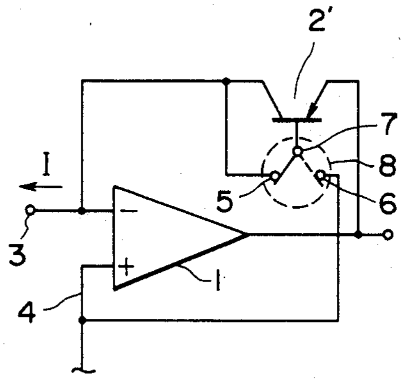

FIGS. 2A and 2B show first and second embodiments, respectively, of a logarithmic compression circuit according to the present invention. FIG. 2A is a diagram of a circuit in which an NPN transistor is used for logarithmic compression; and FIG. 2B is a diagram of a circuit in which a PNP transistor is used for logarithmic compression. In FIGS. 2A and 2B, reference numeral 1 denotes an operational amplifier; references 2 and 2' denote logarithmic compression NPN and PNP transistors, respectively; reference numerals 3 and 4 denote the inverting and non-inverting input terminals, respectively, of each amplifier; reference numeral 8 denotes switching means which, in this case, are each a relay such as an electromagnetic relay constituting a mechanical switching means; reference numerals 5 and 6 denote the contacts of each relay 8; and reference numeral 7 denotes the common contact of the relay. Contact 5 is connected to the respective collector terminals of transistors 2 and 2'; contact 6 is connected to the respective corresponding non-inverting inputs 4 of amplifiers 1; and common contact 7 is connected to the respective corresponding base terminals of transistors 2 and 2'.

In FIG. 2A, when a low signal current flows into inverting input 3, relay contact 6 is connected to common contact 7 while a high signal current flows into input 3, contact 5 is connected to contact 7.

FIG. 2B, when a low signal current flows out of inverting input 3, contact 6 is connected to contact 7 while when a high signal current flows out of input 3, contact 5 is connected to contact 7.

Figure 3:
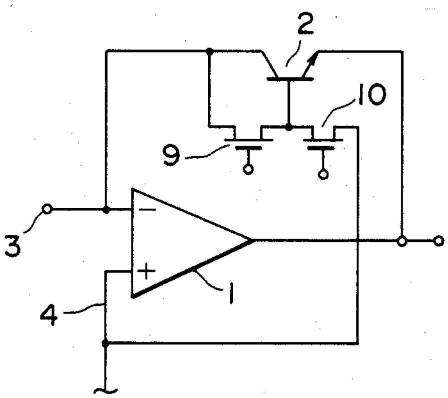
FIG. 3 shows a third embodiment of the logarithmic compression circuit according to the present invention.

FIG. 3 shows a third embodiment of the present invention, wherein in the FIG. 2A embodiment relay 8 is replaced with electronic switching means, shown herein as MOS FETs 9 and 10. When a low signal current flows into inverting input 3, a gating signal is applied to the gate of FET 10 to render same conductive. When a high signal current flows into terminal 3, a gating signal is applied to FET 9 to render same conductive. If semiconductor elements such as MOS FETs 9 and 10 are used as switching means, they may be formed on a semiconductor substrate of the logarithmic compression circuit according to the present invention, and the resulting circuit will be inexpensive and easy to control from external means.

Figure 1A:
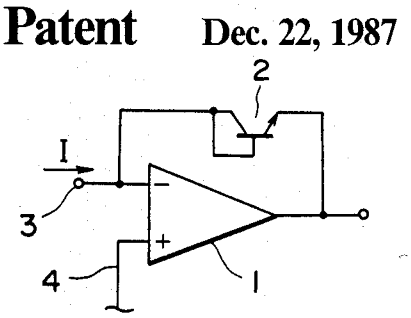
FIG. 1A PRIOR ART
FIGS. 1A and 1B are each a diagram of a conventional logarithmic compression circuit.
Figure 1B:
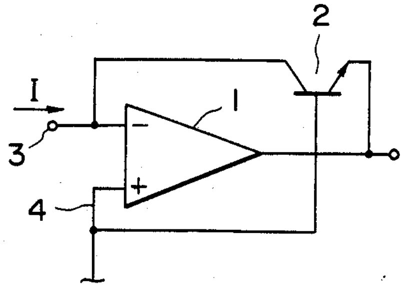
FIG. 1B PRIOR ART

In the above embodiments, if a circuit portion such as shown in FIG. 1A, which does not oscillate when a high signal current is input thereto, is used by switching the switching means when a high signal current is input to a circuit portion, while the circuit portion such shown in FIG. 1B, the logarithmic compression characteristic of which does not deteriorate when a lower signal current is input thereto, is used by switching the switching means when a lower signal current is input to the circuit portion just mentioned, the entire circuit can cope with a wide range of signal currents.

As described above in detail, according to the embodiment of a logarithmic compression circuit, provision of switching means serves to prevent both oscillation of the circuit during high signal current input to same and deterioration of the logarithmic compression characteristic of the circuit during low signal current input to same. Thus a low-cost logarithmic compression circuit which can cope with a wide range of signal currents is provided.

What I claim is:

1. A logarithmic compression circuit comprising:

an operational amplifier having inverting and noninverting inputs and an output;

a transistor having an emitter, a collector and a base for logarithmic compression, one of the emitter and collector of said transistor being connected to the inverting input of said operational amplifier, the other of the emitter and collector of said transistor being connected to the output of said operational amplifier; and switching means, connected between the base of said transistor and the non-inverting input of said operational amplifier, for connecting the base of said transistor to the non-inverting input of said operational amplifier in response to a generation of a low level signal at the inverting input of said operational amplifier and for connecting the base of said transistor to the inverting input of said operational amplifier in response to a generation of a high level signal at the inverting input of said operational amplifier.

2. A circuit according to claim 1, wherein said switching means includes mechanical switching means.

3. A circuit according to claim 2, wherein said mechanical switching means includes an electromagnetic relay.

4. A circuit according to claim 1, wherein said switching means includes electronic switching means.

5. A circuit according to claim 4, wherein said electronic switching means includes a MOS FET.

6. A circuit according to claim 1, wherein said transistor is of the NPN type.

7. A circuit according to claim 1, wherein said transistor is of the PNP type.

* * * * *

UNITED STATES PATENT AND TRADEMARK OFFICE
CERTIFICATE OF CORRECTION

PATENT NO. : 4,714,844

DATED : December 22, 1987

INVENTOR(S) : KAZUHIKO MUTO

It is certified that error appears in the above-identified patent and that said Letters Patent is hereby corrected as shown below:

COLUMN 1

Line 42, "vided" should read --vide--.

COLUMN 2

Line 8, "references 2" should read --reference numerals 2--.
Line 21, "plifiers 1;" should read --plifier 1;--.
Line 26, "while" should read --while when--.
Line 50, "such" should read "such as".
Line 58, "the em-" should read --the present em---.

COLUMN 3

Line 1, "nonin" should read --non-in--.

Signed and Sealed this

Twenty-eighth Day of February, 1989

*Attest:*

DONALD J. QUIGG

*Attesting Officer*

*Commissioner of Patents and Trademarks*